(12) United States Patent
Chang et al.

(10) Patent No.: US 10,062,604 B2
(45) Date of Patent: Aug. 28, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ching-Yu Chang, Taipei (TW); Ssu-I Fu, Kaohsiung (TW); Yu-Hsiang Hung, Tainan (TW); Chih-Kai Hsu, Tainan (TW); Wei-Chi Cheng, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/643,488

(22) Filed: Jul. 7, 2017

(65) Prior Publication Data

US 2017/0323824 A1 Nov. 9, 2017

Related U.S. Application Data

(62) Division of application No. 15/172,161, filed on Jun. 3, 2016, now Pat. No. 9,735,047.

(30) Foreign Application Priority Data

May 5, 2016 (CN) .......................... 2016 1 0292063

(51) Int. Cl.
*H01L 29/66* (2006.01)
*H01L 21/768* (2006.01)
(Continued)

(52) U.S. Cl.
CPC ...... *H01L 21/7682* (2013.01); *H01L 21/0228* (2013.01); *H01L 21/02164* (2013.01);
(Continued)

(58) Field of Classification Search
None
See application file for complete search history.

(56) References Cited

U.S. PATENT DOCUMENTS 5,640,041 A 6/1997 Lur
6,238,987 B1 * 5/2001 Lee ..................... H01L 29/4966
257/E29.16
(Continued)

OTHER PUBLICATIONS

Chen, Title of Invention: Interconnect Structure, Interconnect Layout Structure, and Manufacturing Method Thereof, U.S. Appl. No. 15/007,212, filed Jan. 27, 2016.
(Continued)

*Primary Examiner* — Minh-Loan Tran
(74) *Attorney, Agent, or Firm* — Winston Hsu

(57) ABSTRACT

A semiconductor device includes: a substrate, a gate structure on the substrate, and a spacer adjacent to the gate structure, in which the spacer extends to a top surface of the gate structure, a top surface of the spacer includes a planar surface, the spacer encloses an air gap, and the spacer is composed of a single material. The gate structure includes a high-k dielectric layer, a work function metal layer, and a low resistance metal layer, in which the high-k dielectric layer is U-shaped. The semiconductor device also includes an interlayer dielectric (ILD) layer around the gate structure and a hard mask on the spacer, in which the top surface of the hard mask is even with the top surface of the ILD layer.

7 Claims, 5 Drawing Sheets

(51) Int. Cl.
| | |
|---|---|
| *H01L 29/423* | (2006.01) |
| *H01L 21/02* | (2006.01) |
| *H01L 21/311* | (2006.01) |
| *H01L 21/8234* | (2006.01) |
| *H01L 27/088* | (2006.01) |
| *H01L 21/28* | (2006.01) |
| *H01L 21/8238* | (2006.01) |
| *H01L 23/485* | (2006.01) |

(52) U.S. Cl.
CPC .... *H01L 21/02274* (2013.01); *H01L 21/2815* (2013.01); *H01L 21/28132* (2013.01); *H01L 21/28141* (2013.01); *H01L 21/28247* (2013.01); *H01L 21/31105* (2013.01); *H01L 21/823431* (2013.01); *H01L 21/823456* (2013.01); *H01L 21/823462* (2013.01); *H01L 21/823468* (2013.01); *H01L 21/823864* (2013.01); *H01L 27/0886* (2013.01); *H01L 29/42364* (2013.01); *H01L 29/6653* (2013.01); *H01L 29/6656* (2013.01); *H01L 29/66689* (2013.01); *H01L 29/66719* (2013.01); *H01L 23/485* (2013.01)

(56) References Cited

U.S. PATENT DOCUMENTS

| | | |
|---|---|---|
| 8,421,166 B2 | 4/2013 | Chi et al. |
| 2014/0110798 A1 | 4/2014 | Cai |
| 2016/0163816 A1 | 6/2016 | Yu |

OTHER PUBLICATIONS

Lin, Title of Invention: Semiconductor Structure and Method for Manufacturing the Same, U.S. Appl. No. 15/011,996, filed Feb. 1, 2016.

* cited by examiner

SEMICONDUCTOR DEVICE AND METHOD FOR FABRICATING THE SAME

CROSS REFERENCE TO RELATED APPLICATIONS

This application is a division of U.S. application Ser. No. 15/172,161 filed Jun. 3, 2016, and incorporated herein by reference in its entirety.

BACKGROUND OF THE INVENTION

1. Field of the Invention

The invention relates to a method for fabricating semiconductor device, and more particularly, to a method of forming spacer enclosing void adjacent to a gate structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

However, parasitic capacitor resulted between gate structure and contact plug has become a common problem in current FinFET fabrication process and also influenced the performance of the entire device substantially. Hence, how to improve the current process to resolve this issue has become an important task in this field.

SUMMARY OF THE INVENTION

According to a preferred embodiment of the present invention, a method for fabricating semiconductor device is disclosed. The method includes: providing a substrate; forming a gate structure on the substrate; and forming a first spacer enclosing an air gap adjacent to the gate structure, in which the first spacer is composed of a single material.

According to another aspect of the present invention, a semiconductor device includes: a substrate, a gate structure on the substrate, and a spacer adjacent to the gate structure, in which the spacer extends to a top surface of the gate structure, a top surface of the spacer includes a planar surface, the spacer encloses an air gap, and the spacer is composed of a single material. The gate structure includes a high-k dielectric layer, a work function metal layer, and a low resistance metal layer, in which the high-k dielectric layer is U-shaped. The semiconductor device also includes an interlayer dielectric (ILD) layer around the gate structure and a hard mask on the spacer, in which the top surface of the hard mask is even with the top surface of the ILD layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
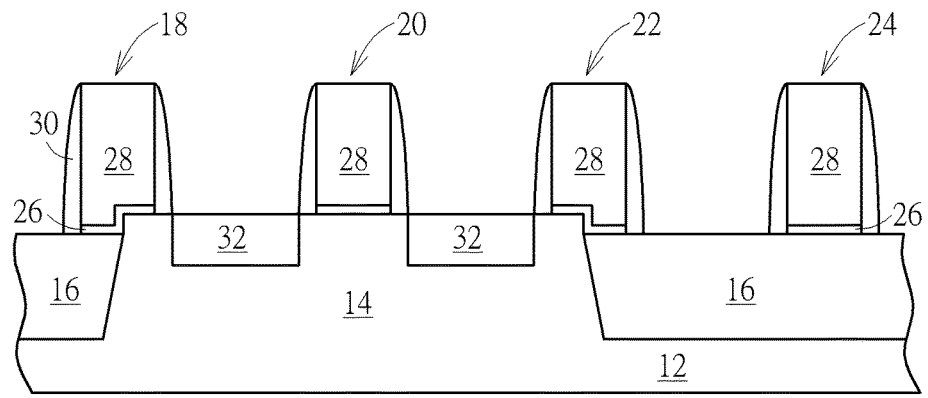
FIGS. 1-9 illustrate a method for fabricating a semiconductor device according to a preferred embodiment of the present invention.

Referring to FIGS. 1-9, FIGS. 1-9 illustrate a method for fabricating a semiconductor device according to a preferred embodiment of the present invention. As shown in FIG. 1, a substrate 12, such as a silicon substrate or silicon-on-insulator (SOI) substrate is provided. In this embodiment, at least a fin-shaped structure 14 is formed on the substrate 12, in which the bottom of the fin-shaped structure 14 is surrounded by a shallow trench isolation (STI) 16 preferably made of silicon oxide. It should be noted that even though this embodiment pertains to a FinFET process, it would also be desirable to apply the process of this embodiment to a non-planar MOS transistor, which is also within the scope of the present invention.

The fin-shaped structure 14 of this embodiment is preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 of this embodiment could also be obtained by first forming a patterned mask (not shown) on the substrate, 12, and through an etching process, the pattern of the patterned mask is transferred to the substrate 12 to form the fin-shaped structure 14. Moreover, the formation of the fin-shaped structure 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 14. These approaches for forming fin-shaped structure 14 are all within the scope of the present invention.

Next, gate structures or dummy gates 18, 20, 22, 24 are formed on the substrate 12. Preferably, the formation of the dummy gates 18, 20, 22, 24 could be accomplished by a gate first process, a high-k first approach from gate last process, or a high-k last approach from gate last process. Since this embodiment pertains to a high-k last approach, it would be desirable to sequentially deposit a gate dielectric layer or interfacial layer, a gate material layer, and a selective hard mask on the substrate 12, conduct a pattern transfer process by using a patterned resist (not shown) as mask to remove part of the gate material layer and part of the gate dielectric layer, and then strip the patterned resist to form dummy gates 18, 20, 22, 24 or gate structures on the fin-shaped structure 14 and the STI 16. Each of the dummy gates 18, 20, 22, 24 preferably includes a patterned gate dielectric layer 26 and a patterned material layer 28

Next, at least a spacer 30 is formed on the sidewalls of each of the dummy gates 18, 20, 22, 24, a source/drain region 32 and/or epitaxial layer (not shown) is formed in the fin-shaped structure 14 and/or substrate 12 adjacent to two sides of the spacer 30, and a selective silicide (not shown) is formed on the surface of the source/drain region 32 and/or epitaxial layer. In this embodiment, the spacer 30 could be a single spacer or a composite spacer. For instance, the spacer 30 could further include an offset spacer (not shown) and a main spacer (not shown), and the spacer 30 could be selected from the group consisting of $SiO_2$, SiN, SiON, and SiCN. The source/drain region 32 and epitaxial layer could include different dopants or different material depending on the type of transistor being fabricated. For instance, the source/drain region 32 could include p-type or n-type dopants and the epitaxial layer could include SiGe, SiC, or SiP.

Figure 2:
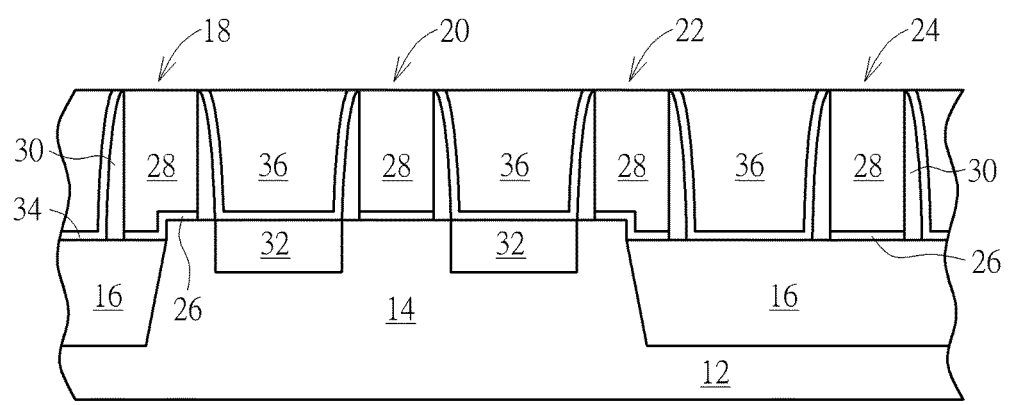

Next, as shown in FIG. 2, a contact etch stop layer (CESL) 34 composed of silicon nitride could be selectively formed on the substrate 12 to cover the dummy gates 18, 20, 22, 24, and an interlayer dielectric layer 36 is formed on the CESL 34. Next, a planarizing process, such as chemical mechanical polishing (CMP) process is conducted to remove part of the ILD layer 36 and part of the CESL 34 to expose the gate material layer 28 composed of polysilicon, in which the top surface of the gate material layer 28 and the top surface of the ILD layer 36 are coplanar.

Figure 3:
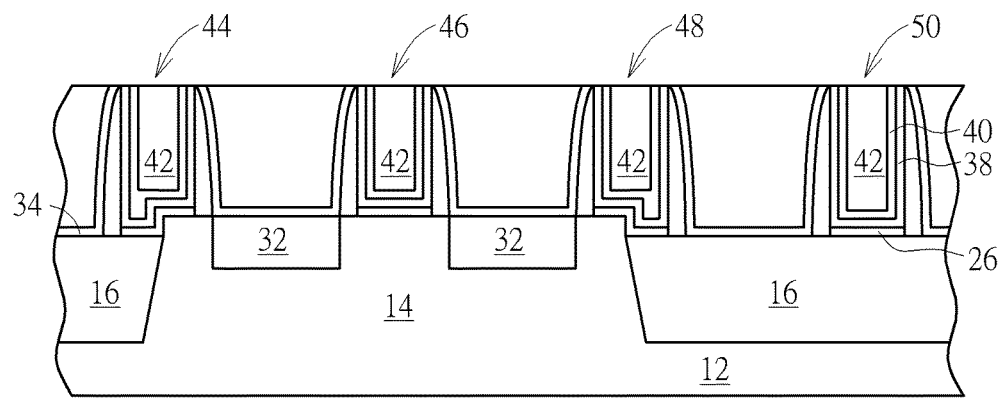

Next, a replacement metal gate (RMG) process is conducted to transform the dummy gates 18, 20, 22, 24 into metal gates. For instance, as shown in FIG. 3, a selective dry etching or wet etching process could be conducted by using etchant including ammonium hydroxide ($NH_4OH$) or tetramethylammonium hydroxide (TMAH) to remove the gate material layer 28 of dummy gates 18, 20, 22, 24 for forming recesses (not shown) in the ILD layer 36. Next, a high-k dielectric layer 38, a work function metal layer 40, and a low resistance metal layer 42 are sequentially formed in the recesses, and a planarizing process, such as CMP is conducted to remove part of the low resistance metal layer 42, part of the work function metal layer 40, and part of the high-k dielectric layer 38 to form metal gates or gate structures 44, 46, 48, 50. Since this embodiment pertains to a high-k last process, each of the gate structures 44, 46, 48, 50 preferably includes an interfacial layer or gate dielectric layer 26, a U-shaped high-k dielectric layer 38, a U-shaped work function metal layer 40, and a low resistance metal layer 42.

In this embodiment, the high-k dielectric layer 38 is preferably selected from dielectric materials having dielectric constant (k value) larger than 4. For instance, the high-k dielectric layer 38 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, BST), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 40 is formed for tuning the work function of the later formed metal gates to be appropriate in an NMOS or a PMOS. For an NMOS transistor, the work function metal layer 40 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 40 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 40 and the low resistance metal layer 42, in which the material of the barrier layer may include titanium (Ti), titanium nitride (TiN), tantalum (Ta) or tantalum nitride (TaN). Furthermore, the material of the low-resistance metal layer 42 may include copper (Cu), aluminum (Al), titanium aluminum (TiAl), cobalt tungsten phosphide (CoWP) or any combination thereof.

Figure 4:
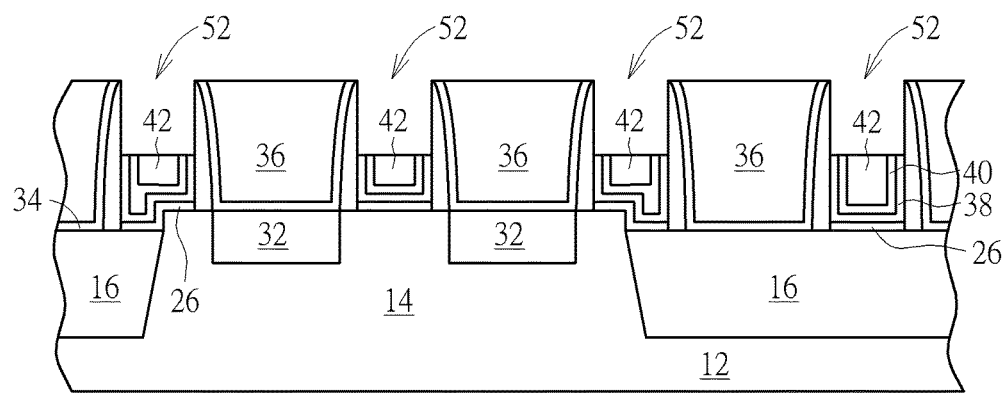

Next, as shown in FIG. 4, part of the gate structures 44, 46, 48, 50 is removed to form recesses 52 so that the top surface of the remaining gate structures 44, 46, 48, 50 is slightly lower than the top surface of the ILD layer 36.

Figure 5:
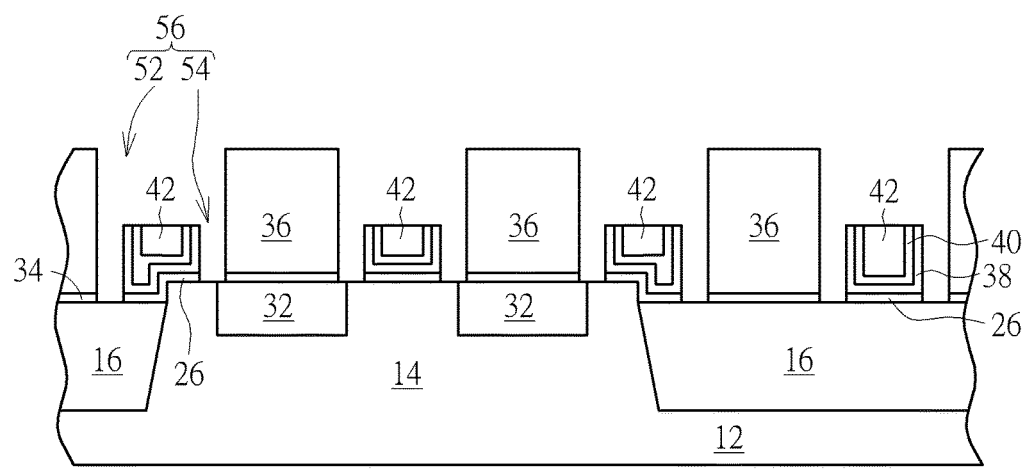

Next, as shown in FIG. 5, an etching process is conducted by using the ILD layer 36 as mask to remove the spacers 30 adjacent to the gate structures 44, 46, 48, 50 and expose part of the STI 16, sidewalls of the gate structures 44, 46, 48, 50, and part of the fin-shaped structure 14 surface. It should be noted that since the spacers 30 of this embodiment are preferably made of silicon nitride and the ILD layer 36 is made of oxides, it would be desirable to use the etching selectivity between these two elements to remove the spacers 30 completely without losing any of the ILD layer 36. This forms another recess 54 adjacent to the gate structures 44, 46, 48, 50, and the recess 54 and the recess 52 from FIG. 4 together form a reverse U-shaped recess 56. Moreover, since both the spacers 30 and the CESL 34 are made of silicon nitride, part of the CESL 34, especially the vertical portions of the CESL 34 are also removed along with the spacers 30. The remaining CESL 34 then reveals a horizontal I-shaped cross-section adjacent to the recess 56. Nevertheless, if the CESL 34 and the spacers 30 were made of different material thereby having different etching selectivity, or a selective buffer layer composed of silicon oxide is formed under the CESL 34, the remaining CESL 34 would have a U-shaped cross-section between the ILD layer 36 and the substrate 12 after spacers 30 are etched.

Figure 6:
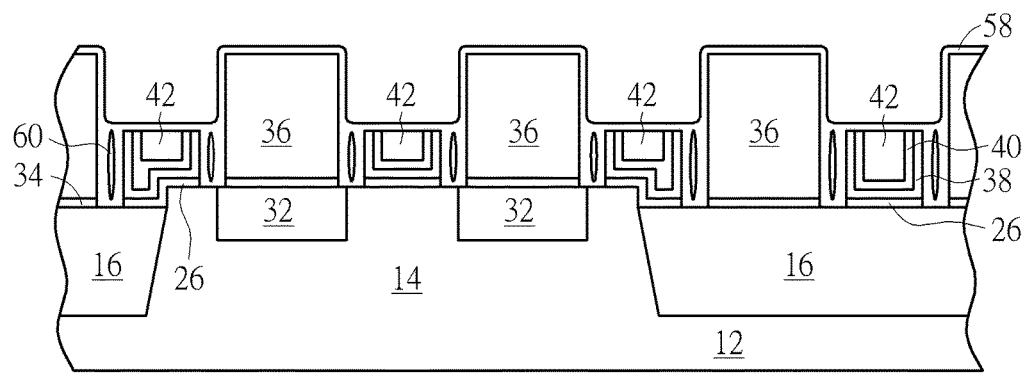

Next, as shown in FIG. 6, a liner 58 is formed on the ILD layer 36 and gate structures 44, 46, 48, 50 and filled into the recesses 56, in which the liner 58 is preferably composed of silicon dioxide, but not limited thereto. In this embodiment, the formation of the liner 58 is accomplished by conducting an atomic layer deposition (ALD) processor high-density plasma (HDP) process. Preferably, the liner 58 is deposited on the top surface of the ILD layer 36, sidewalls of the ILD layer 36 exposed in the recess 56, top surface of the gates structures 44, 46, 48, 50, and sidewalls of the gate structures 44, 46, 48, 50 exposed in the recess 56 without filling the U-shaped recesses 56 completely. It should be noted that as the liner 58 is formed by the aforementioned ALD or HDP process, the deposited liner 58 preferably encloses or surrounds an air gap 60 or void within the liner 58. Specifically, the air gap 60 is formed between the gate structures 44, 46, 48, 50 and the ILD layer 36, in which the top surface of the air gap 60 could be higher than, even with, or lower than the top surface of the gate structures 44, 46, 48, 50. Moreover, even though only a single air gap 60 is formed between each of the gate structures 44, 46, 48, 50 and the ILD layer 36, the number or quantity of the air gap 60 is not limited to one, but could be adjusted depending on the deposition parameter of the liner 58.

Figure 7:
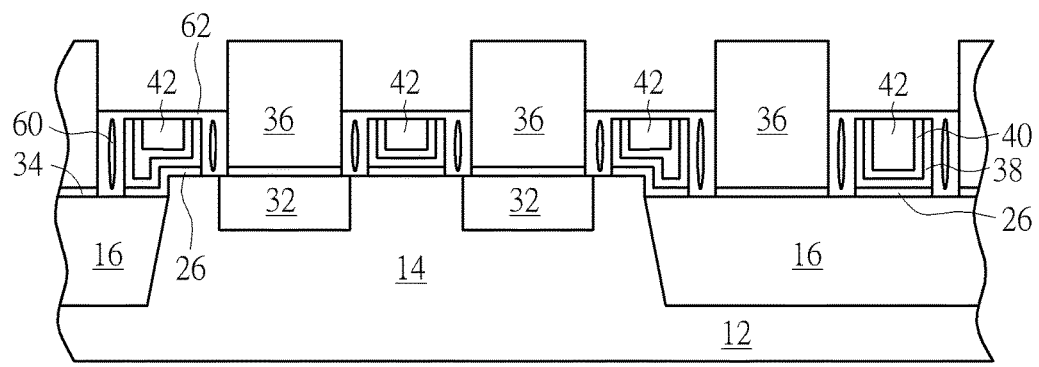

Next, as shown in FIG. 7, a trimming process or an etching process is conducted to remove part of the liner 58 to form spacers 62 between the gate structures 44, 46, 48, 50 and ILD layer 36, in which each of the spacers 62 encloses or completely surrounds at least an air gap 60. In this embodiment, the top surface of the spacers 62 after the trimming process preferably has a planar surface, and the spacers 62 are not only disposed between the gate structures 44, 46, 48, 50 and ILD layer 36 but also extend to and cover the top surface of the gate structures 44, 46, 48, 50 entirely. Moreover, the spacers 62 are preferably made of a single material such as silicon dioxide, but not limited thereto. It would also be desirable to use other dielectric material to fabricate the spacers 62 depending on the demand of the product.

Figure 8:
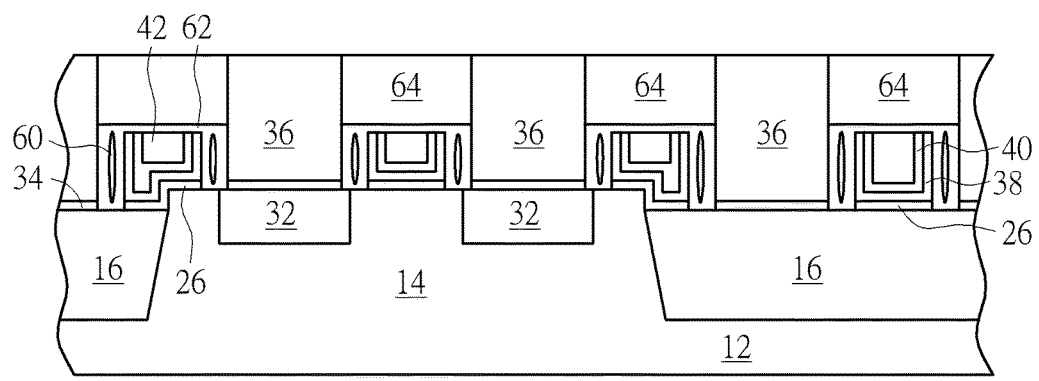

Next, as shown in FIG. 8, a mask layer (not shown) is formed on the ILD layer 36 to fill the recesses 52 above the spacers 62, and a planarizing process, such as CMP is conducted to remove part of the mask layer for forming hard masks 64 on the gate structures 44, 46, 48, 50 and spacers 62, in which the top surface of the hard masks 64 and the top surface of the ILD layer 36 are coplanar. In this embodiment, the hard masks 64 are made of silicon nitride, but not limited thereto.

Figure 9:
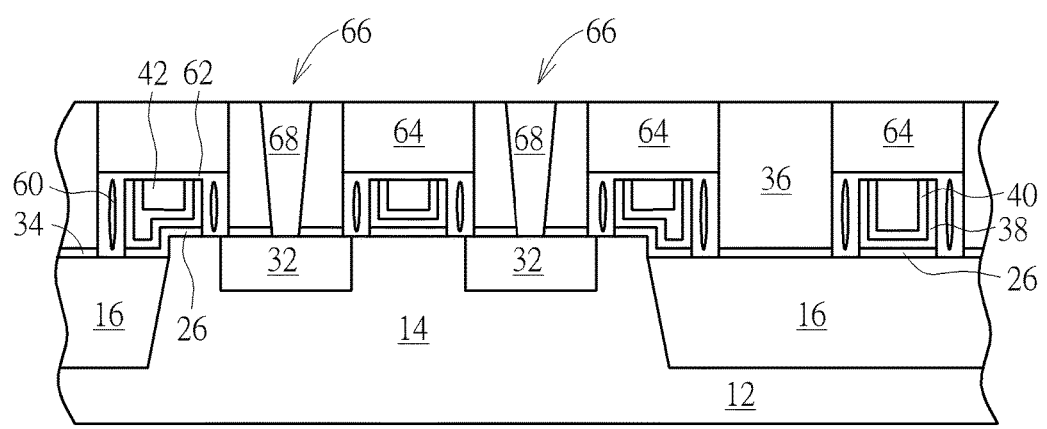

Next, as shown in FIG. 9, a contact plug formation could be conducted to form contact plugs 66 electrically connecting the source/drain regions 32. In this embodiment, the formation of the contact plugs 66 could be accomplished by first removing part of the ILD layer 36 and part of the CESL 34 to form contact holes (not shown), and then depositing a barrier layer (not shown) and a metal layer 68 on the substrate 12 to fill the contact holes. Next, a planarizing process, such as CMP is conducted to remove part of the metal layer 68, part of the barrier layer, and part of the ILD layer 36 to form contact plugs 66, in which the top surface of the contact plugs 66 is even with the top surface of the ILD layer 36. In this embodiment, the barrier layer is selected from the group consisting of Ti, Ta, TiN, TaN, and WN, and the metal layer 68 is selected from the group consisting of Al, Ti, Ta, Nb, Mo, and Cu.

Overall, the present invention first forms metal gate on a substrate, removes the spacer adjacent to the metal gate, and then conducts an ALD process or HDP process to form a new spacer adjacent to the metal gate, in which the newly formed spacer preferably encloses at least an air gap. According to a preferred embodiment of the present invention, it would be desirable to use the air gap to resolve parasitic capacitance resulted from down scaling of the field-effect transistors and boost up the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a gate structure on the substrate and an interlayer dielectric (ILD) layer around the gate structure; and
a spacer enclosing an air gap adjacent to the gate structure and extending to and contacting a top surface of the gate structure, wherein the spacer is composed of a single material and a top surface of the spacer directly on top of the gate structure is lower than a top surface of the ILD layer.

2. The semiconductor device of claim 1, wherein the gate structure comprises a high-k dielectric layer, a work function metal layer, and a low resistance metal layer.

3. The semiconductor device of claim 2, wherein the high-k dielectric layer is U-shaped.

4. The semiconductor device of claim 1, wherein a top surface of the spacer comprises a planar surface.

5. The semiconductor device of claim 1, further comprising a hard mask on the spacer, wherein a top surface of the hard mask and a top surface of the ILD layer are coplanar.

6. The semiconductor device of claim 5, wherein the hard mask comprises silicon nitride.

7. The semiconductor device of claim 1, wherein the spacer comprises silicon dioxide.

* * * * *